United States Patent [19]
Nelson

[11] Patent Number: 6,046,647
[45] Date of Patent: Apr. 4, 2000

[54] VOLTAGE-CONTROLLED OSCILLATOR

[75] Inventor: Dale Harvey Nelson, Shillington, Pa.

[73] Assignee: Lucent Technologies Inc., Murray Hill, N.J.

[21] Appl. No.: 09/207,307

[22] Filed: Dec. 8, 1998

[51] Int. Cl.[7] .............................. H03B 1/04; H03B 5/12; H03B 5/18; H03B 5/36

[52] U.S. Cl. .................. 331/105; 331/68; 331/116 R; 331/116 FE; 331/117 R; 331/117 FE; 331/117 D; 331/108 D; 331/177 V

[58] Field of Search ................ 331/68, 105, 116 R, 331/116 FE, 116 M, 117 R, 117 FE, 117 D, 108 C, 108 D, 158, 175, 177 V, 187

[56] References Cited

U.S. PATENT DOCUMENTS 4,482,820 11/1984 Kohsiek ................................ 307/303

*Primary Examiner*—David Mis

[57] ABSTRACT

A Voltage Controlled Oscillator (VCO) mitigates the effects of package parasitics by providing positive feedback connections, to sustain a desired oscillation, external to the IC package, thereby mitigating the effect of the bond wires and internal parasitics to allow the oscillation to be controlled by the desired external components. The VCO includes an electronic circuit with gain that is at least part of an integrated circuit (IC) and a package for the IC. A passive resonant circuit may be provided external to the IC package. The positive feedback of the electronic circuit is provided through at least one additional lead of the package, such that the connection is external to the package.

25 Claims, 11 Drawing Sheets

COLPITTS VCO

TYPICAL IC IMPLEMENTATION

CIRCUIT WITH ADDED LEAD

VOLTAGE-CONTROLLED OSCILLATOR

FIELD OF THE INVENTION

The present invention relates generally to a voltage-controlled oscillator (VCO), and, more particularly, to a voltage-controlled oscillator design that reduces the effect of package parasitics.

BACKGROUND OF THE INVENTION

The ever-increasing importance of voltage-controlled oscillators (VCOs) in RF devices for the telecommunications field, including 900 MHz telephones, cellular telephones, DECT telephones, RF data links, etc., presents a growing need to reduce the effect of unwanted oscillations due to local resonance, i.e. package parasitics, without reducing the gain of the circuit. At higher operating frequencies, parasitics are on the same order as the resonant tank components and therefore, the impact of package parasitics become more pronounced and more of a concern. In fact, parasitics may significantly affect the operation of a VCO.

FIG. 1 shows a conceptual block diagram of a voltage controlled oscillator consisting of a passive resonant circuit 10, typically on a printed wiring board, connected to an active circuit 20, that is part of an integrated circuit, through package leads which produce parasitic resonance 30. A requirement for oscillation is that active circuit 20 must make up for the losses in the passive resonator 10, which requires that the circuit provide a negative resistance at the resonant frequency of passive resonator 10. The negative resistance is often formed with one or more separate feedback paths into the circuit. Feedback path 40 is illustrated. This negative impedance is usually broadband, and therefore, the parasitic resonance 30 of the package leads can cause the circuit to oscillate at an undesired frequency.

In an attempt to address the concern of undesired oscillation modes due to package parasitics, previous Radio Frequency Voltage Controlled Oscillator (RF VCO) designs have relied on making the active circuit sufficiently narrow band such that it only oscillates at the desired frequency, or adding damping resistors to the leads to make the Q of the parasitic resonance much lower than the Q of the passive resonator. In fact, these techniques may be effective, provided that the passive resonator has a very high Q factor. However these techniques do not provide a broad solution to the problem of package parasitics in VCOs.

Previous designs have also essentially restricted package types and lead assignments to those that minimize lead and bond wire inductance. In addition, in various designs the capacitance to VSS on the pads (PAD1 and PAD2) has been minimized to maintain the unwanted resonant frequency as far above the desired frequency of oscillation as possible, again lowering the likelihood of unwanted oscillation. Finally, electrostatic discharge (ESD) protection diodes are also typically removed from the pads (PAD1 and PAD2) to minimize the capacitance to the VSS. While each of these restrictions help to address the effect package parasitics on VCOs having external tank circuits, the requirements of VCO's in various RF devices do not always tolerate such restrictions.

Finally, other attempts to address the problems associated with package parasitics include designing a VCO having an "internal" LC tank (as described for example in IEEE Journal of Solid-State Circuits, Vol. 32, No. 5, May 1997, p. 736), which uses integrated planar inductors in the resonance LC-tank, so that external elements are unnecessary, i.e., thereby removing the bond wires and leads from the resonant circuit path and reducing package parasitics. However, for good phase noise performance, the resonant circuit should have a large Q; currently sufficiently large Q on-chip inductors are not available. In addition, this technique requires high Q on-chip varactors, which also currently do not exist. Accordingly, the phase-noise performance of on-chip oscillators is limited by the Q of the resonating elements available on-chip, again giving rise to poor performance of the VCO.

SUMMARY OF THE INVENTION

The present invention solves the problems described above by providing a VCO design that mitigates the effects caused by bond wire inductance and bond pad capacitance, i.e., package parasitics.

In particular, the inventive Voltage Controlled Oscillator (VCO) includes an electronic circuit, with gain, that is at least part of an integrated circuit (IC), a package for the IC and a passive resonant circuit external to the IC package. In the circuit, positive feedback to sustain a desired oscillation is provided through at least one additional lead of the package.

In a preferred embodiment, the electronic circuit is a transistor pair together with bias circuits to form active gain for the VCO, and in yet a further embodiment, the transistor pair is capacitively cross-coupled by connections made external to the package, thereby mitigating the effect of the bond wires and internal parasitics to allow the oscillation to be controlled by the desired external components.

In one particular embodiment, a separate one of four bond pads are connected to a collector of the first transistor, a collector of the second transistor, a base of the first transistor, and a base of the second transistor, and, the base of the first transistor and the collector of the second transistor are connected outside the package, and the base of the second transistor and the collector of the first transistor are connected outside the package.

The transistors of the VCO may be bipolar or MOS in type. The resonant circuit may be an inductor-capacitor tank. The capacitance may include a varactor diode to achieve frequency control through a voltage to capacitance change, and the resonant circuit may be a crystal and varactor combination.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION

For the reasons described above, it is difficult to eliminate the need for "external" elements in a VCO (i.e., to remove the bond wires and leads from the resonant circuit path and reduce package parasitics). Accordingly, it is desirable to design a typical VCO circuit, including a single transistor or a cross-coupled transistor pair, contained in an integrated circuit (IC) package, with an "external" resonant tank circuit, having reduced package parasitics.

Figure 2:
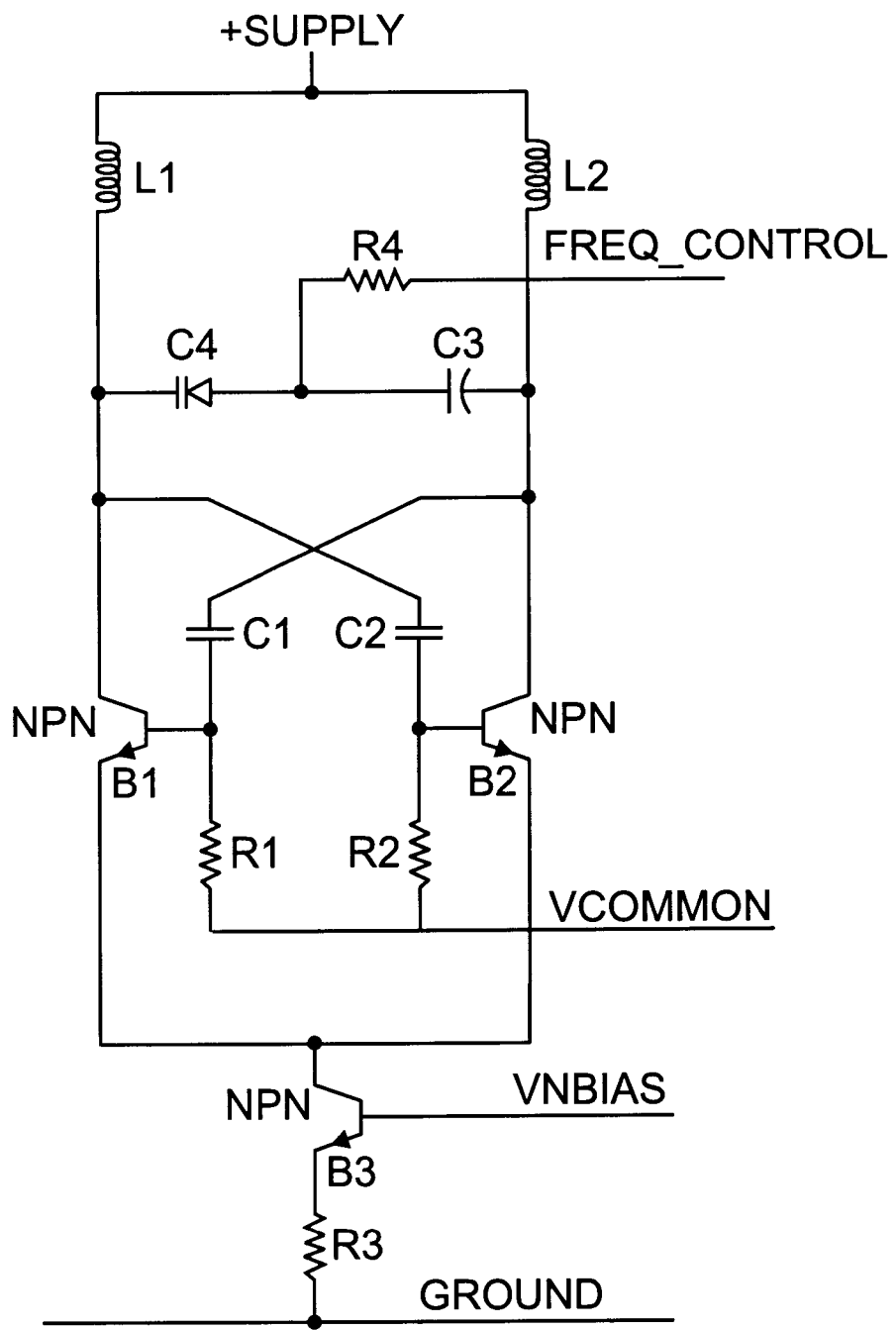
FIG. 2 shows one embodiment of a conventional oscillator circuit.

FIG. 2 shows one basic conventional oscillator design. As shown, cross-coupled NPN transistors, B1 and B2, are coupled to form a positive feedback circuit, which presents a negative impedance to the tank circuit formed by inductor L1, inductor L2, blocking capacitor C3 and varactor diode C4. This arrangement allows for a very low power supply voltage. Capacitor C1 and resistor R1, and capacitor C2 and resistor R2, prevent the circuit from having positive feedback at DC (which would form a latch and therefore would not be useful for creating oscillation).

The tank circuit is "tuned" by changing the bias voltage across varactor diode C4. Resistor R4 isolates the frequency control source from the tank circuit (Applicant notes that for a fixed frequency application, R4 could be eliminated and varactor diode C4-blocking capacitor C3 could be replaced with a mechanical trimmer capacitor, which, during manufacture, could be adjusted to provide the desired frequency).

Figure 3:
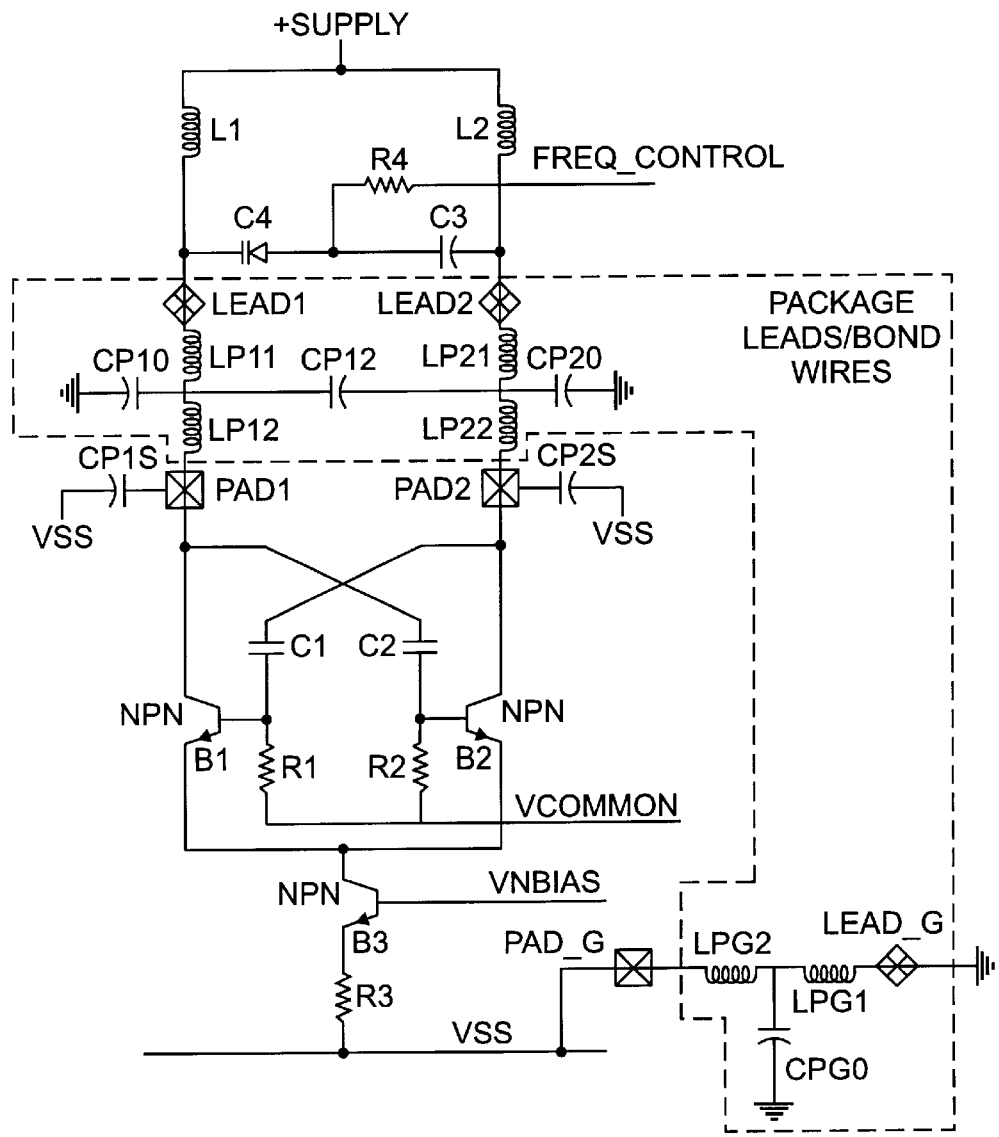
FIG. 3 shows the conventional oscillator circuit of FIG. 2, as implemented with the tank circuit external to the integrated circuit (IC).

Next, FIG. 3 illustrates the active oscillator circuit of FIG. 2, including the cross-coupled transistor pair, contained in an integrated circuit (IC) package (the dotted line portion indicates the package leads/bond wire inductances and capacitances), with an "external" resonant tank circuit. In particular, as noted above and as shown in the FIG. 3 exemplary circuit, a local voltage-controlled oscillator for RF devices typically uses an active circuit, inside an integrated circuit, working with an external tank circuit, consisting of for example, inductors, a varactor diode, a blocking capacitor and bias feed for the varactor diode. The varactor's capacitance is a function of its reverse bias voltage and is used to tune the resonant frequency of the tank. Examining FIG. 3 however, we see that the bond pad capacitance and the bond wire inductance become an additional undesired second resonant tank circuit, i.e., a circuit with inductance and capacitance which stores energy at frequencies near its resonant frequency, causing unwanted oscillations. In FIG. 3, the second tank circuit formed by the bond wires and internal capacitors have a resonance typically only a factor of two to six times higher in frequency than the desired circuit.

In FIG. 3, CP10, CP12 and CP20, and LP11, LP12, LP21 and LP22 model the package lead and bond wire parasitic capacitances and inductances, respectively, More specifically, referring to FIG. 3, at some sufficiently high frequency, varactor diode C4 and blocking capacitor C3 effectively become a "short circuit" across LEAD 1 and LEAD 2. Therefore, the next dominant oscillatory mode is due to the LP11 and LP21 inductance of the lead-frame with the internal capacitance of the IC bond pad and lead frame capacitance. Accordingly, the circuit of FIG. 3 could oscillate at the unwanted higher frequency due to the high bandwidth of the cross-coupled transistors.

Figure 4:
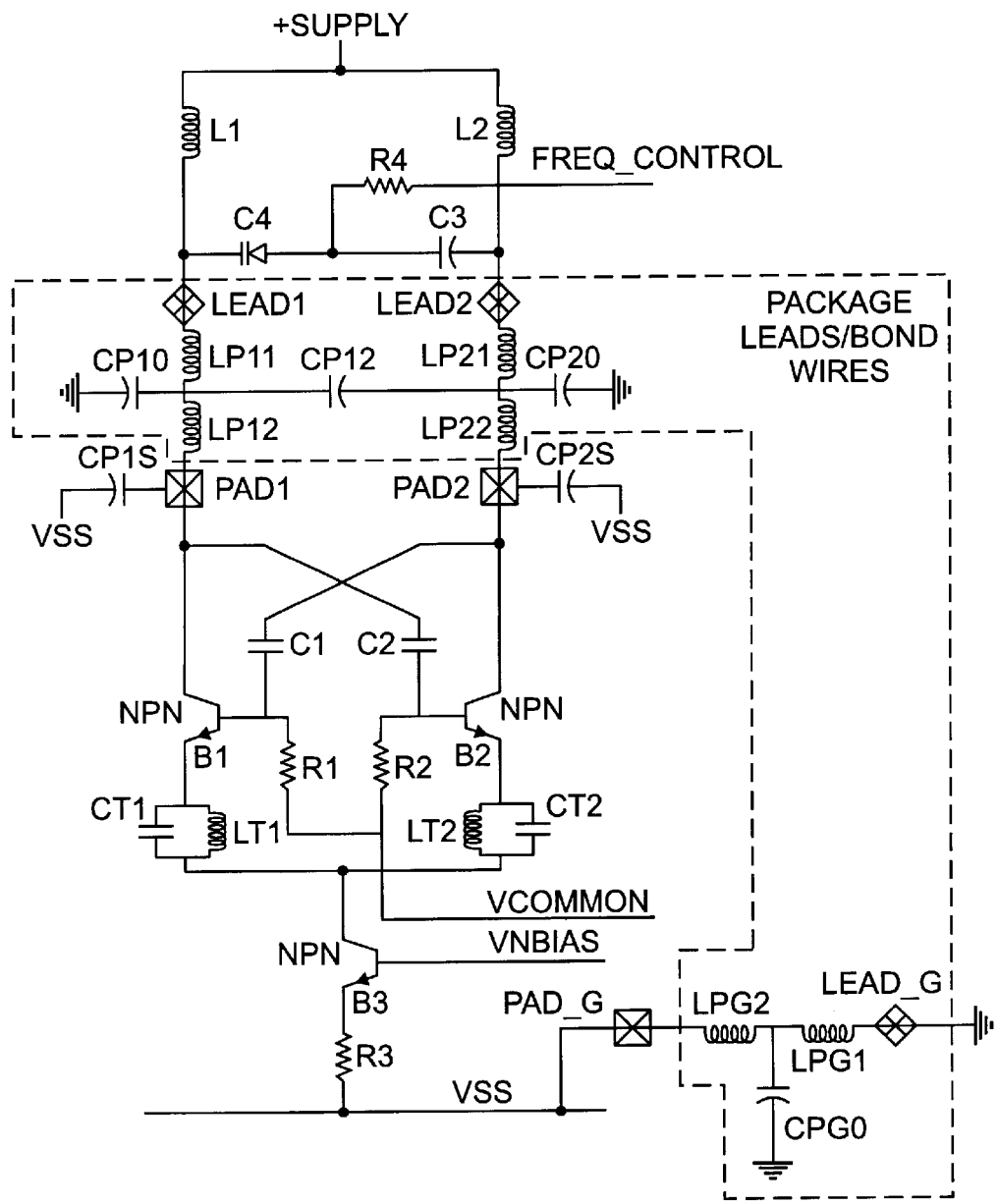
FIG. 4 shows one prior art VCO design to reduce package parasitics.

FIG. 4 shows one previously proposed technique for mitigating package parasitics in a VCO having an external tank circuit. Specifically, "traps" LT1–CT1 and LT2–CT2 are added to the circuit shown in FIG. 3 to significantly lower the gain of the cross-coupled transistors at the frequency of concern, the resonant frequency of the unwanted parasitic oscillation. In particular, trap LT1–CT1 is added to the emitter of transistor B1 and trap LT2–CT2 is added to the emitter of transistor B2. However, this technique presents various problems, including the issues discussed earlier with regard to the requirements of on-chip inductors. In addition, the design of FIG. 4 presents difficulty with regard to the accuracy with which the tanks for the traps can be matched to the undesired oscillation mode.

Figure 5:
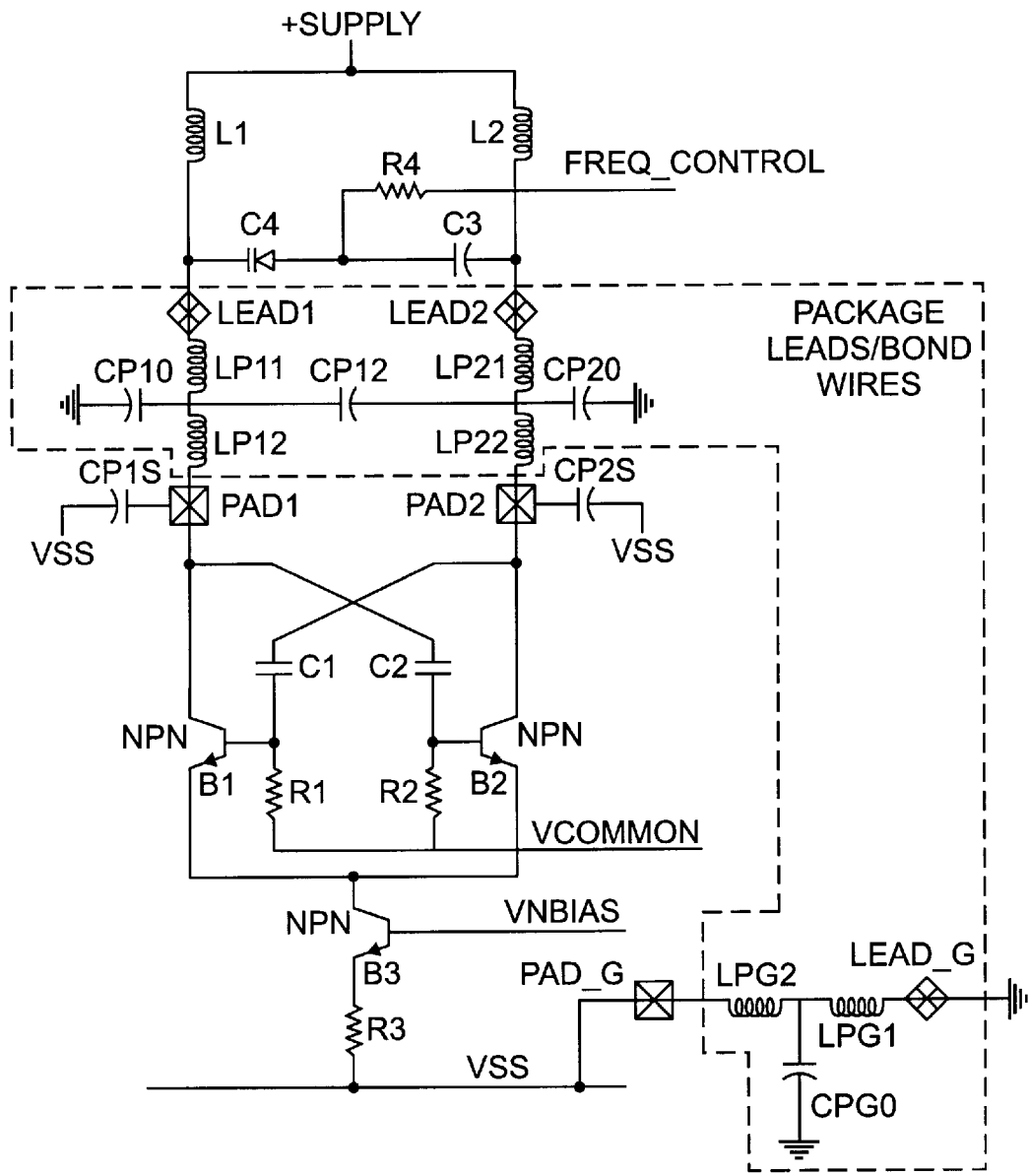
FIG. 5 shows another prior art VCO design to reduce package parasitics.

FIG. 5 shows a second previously proposed technique for mitigating package parasitics in a VCO. In FIG. 5, resistor RL1 and resistor RL2 are added to the external circuit to lower the Q of the undesired resonant circuit. Specifically, "damping" resistors RL1 and RL2 are added in series with package parasitic inductances LP11 and LP21. However, various problems are also presented with this technique. First, resistors RL1 and RL2 should obviously be as small as possible to avoid significant voltage drop across each resistor and degradation in the phase-noise performance of the oscillator. Although the phase noise performance is less affected by the damping effect of RL1 and RL2 at lower values, e.g., values of 10 ohms or less, at those values the resistors may be of little value in lowering the Q of the undesired resonant circuit and in fact narrow the tuning range of the circuit. An additional problem presented by this technique is that to account for the extra resistance added to the circuit, the negative resistance of the cross-coupled transistor pair must be increased. Accordingly, the technique proposed in FIG. 5 to mitigate VCO package parasitics is also a less than desirable approach.

Figure 1:
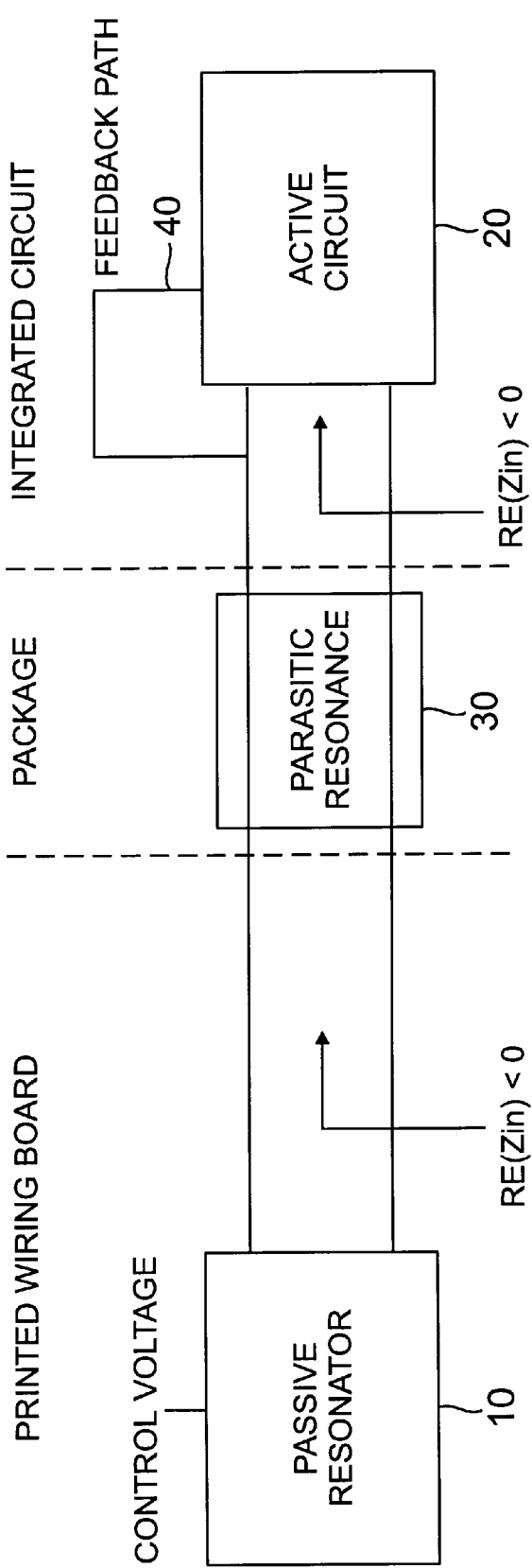
FIG. 1 shows a simplified block diagram of a conventional oscillator design.
Figure 6:
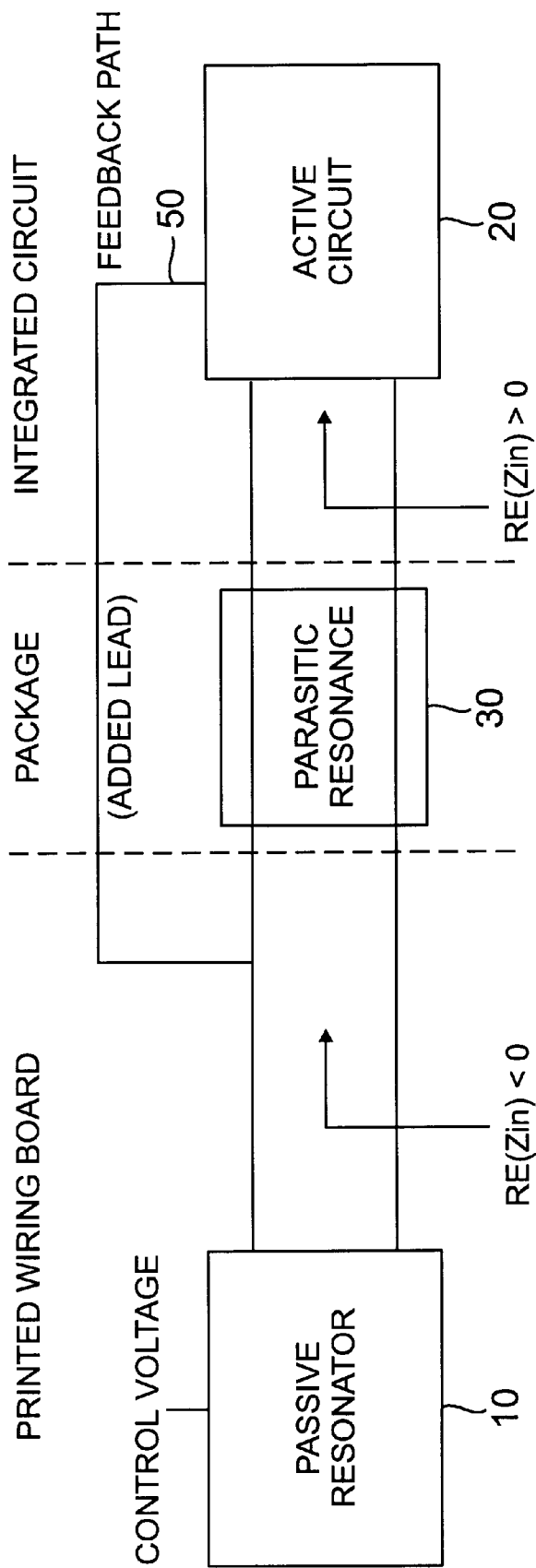
FIG. 6 shows a simplified block diagram of a VCO design incorporating the aspects of the invention.

FIG. 6 shows a conception block diagram of a VCO proposed by the invention. The feedback to the active circuit is achieved with the use of one (discussed below with reference to FIG. 10) or more (discussed below with reference to FIG. 7) additional leads. Unlike feedback path 40 shown in FIG. 1, the "added lead" feedback path 50 of FIG. 6 provides the connection outside of the IC package. Analysis of the terminals to the active circuit will show the real part of the input impedance can be always positive, but at the terminals of the passive resonator it can have a negative impedance because the feedback path now comes from outside the package.

Figure 7:
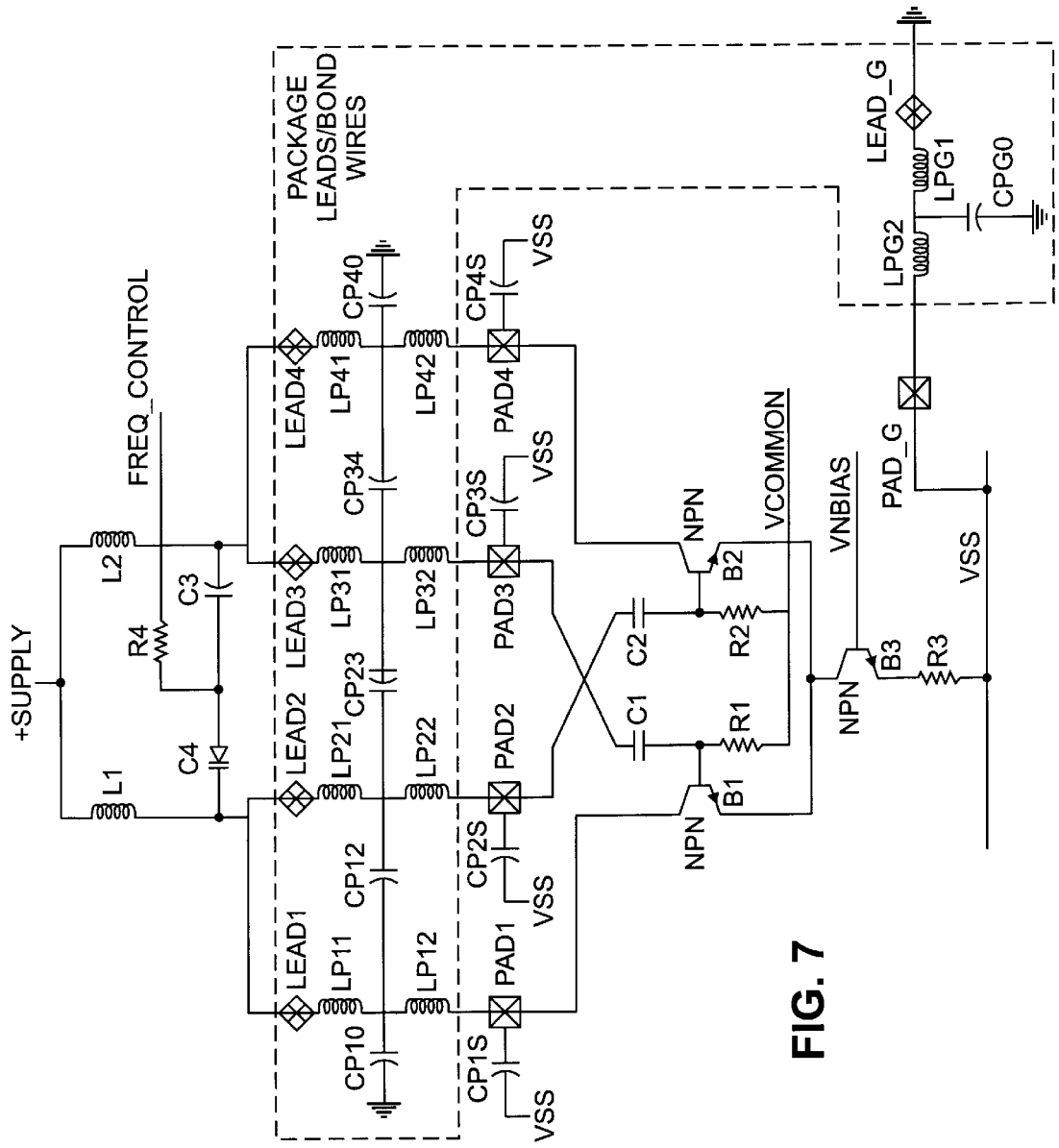
FIG. 7 shows one embodiment of a VCO circuit incorporating the inventive technique.

FIG. 7 shows one embodiment of the aspects proposed by the invention, incorporated into the VCO design of FIG. 3. Referring to FIG. 7, a VCO design is illustrated that embodies the inventive technique. It will be appreciated by those skilled in the art that various other embodiments, incorporating the same technique, are possible and are not outside the scope of the invention.

As shown in FIG. 7, NPN transistors B1 and B2 are coupled to form a positive feedback circuit. However, the capacitive cross-coupling is brought out of the IC through separate leads and the connection made outside the package. Specifically, the collector of transistor B1 is connected to LEAD 1 through PAD 1 and the base of transistor B2 is connected to LEAD 2 through PAD 2. A connection between LEADs 1 and 2 is then made outside the IC package, thereby mitigating the effect of package parasitics. (It will be appreciated that the discussion above is equally applicable to the external cross-coupling of the collector of B2 with the base of B1 and therefore will not be repeated).

Figure 8:
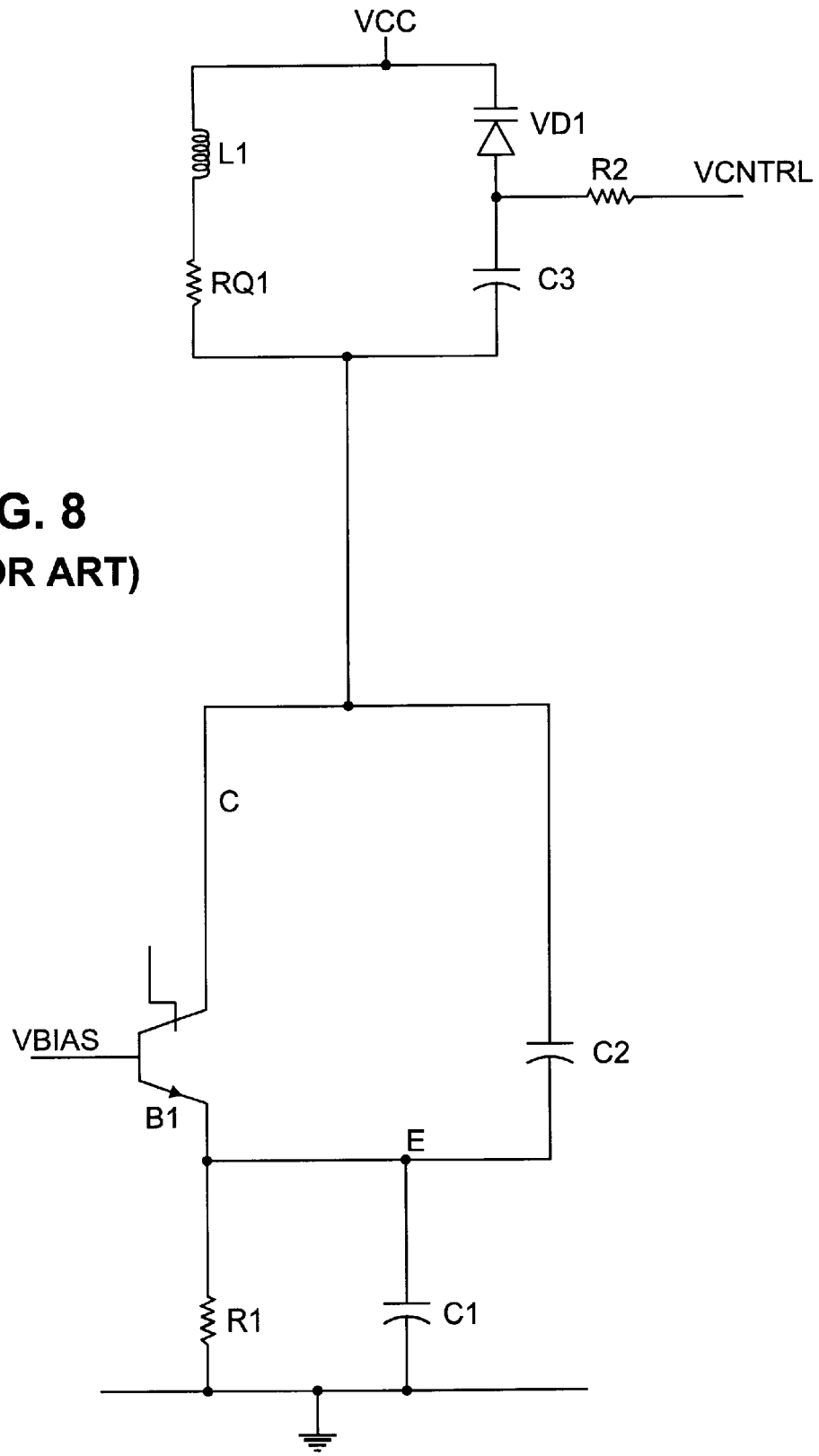
FIG. 8 shows one embodiment of a conventional Colpitts oscillator circuit.

FIG. 8 shows a second basic conventional Colpitts oscillator design. As shown, NPN transistor, B1, has a positive feedback circuit, which presents a negative impedance to the tank circuit formed by inductor L1, resistor RQ1, blocking capacitor C3 and varactor diode VD1. As in FIG. 5, the tank circuit is "tuned" by changing the bias voltage across the varactor diode (VD1). Resistor R2 isolates the frequency control source from the tank circuit.

Figure 9:
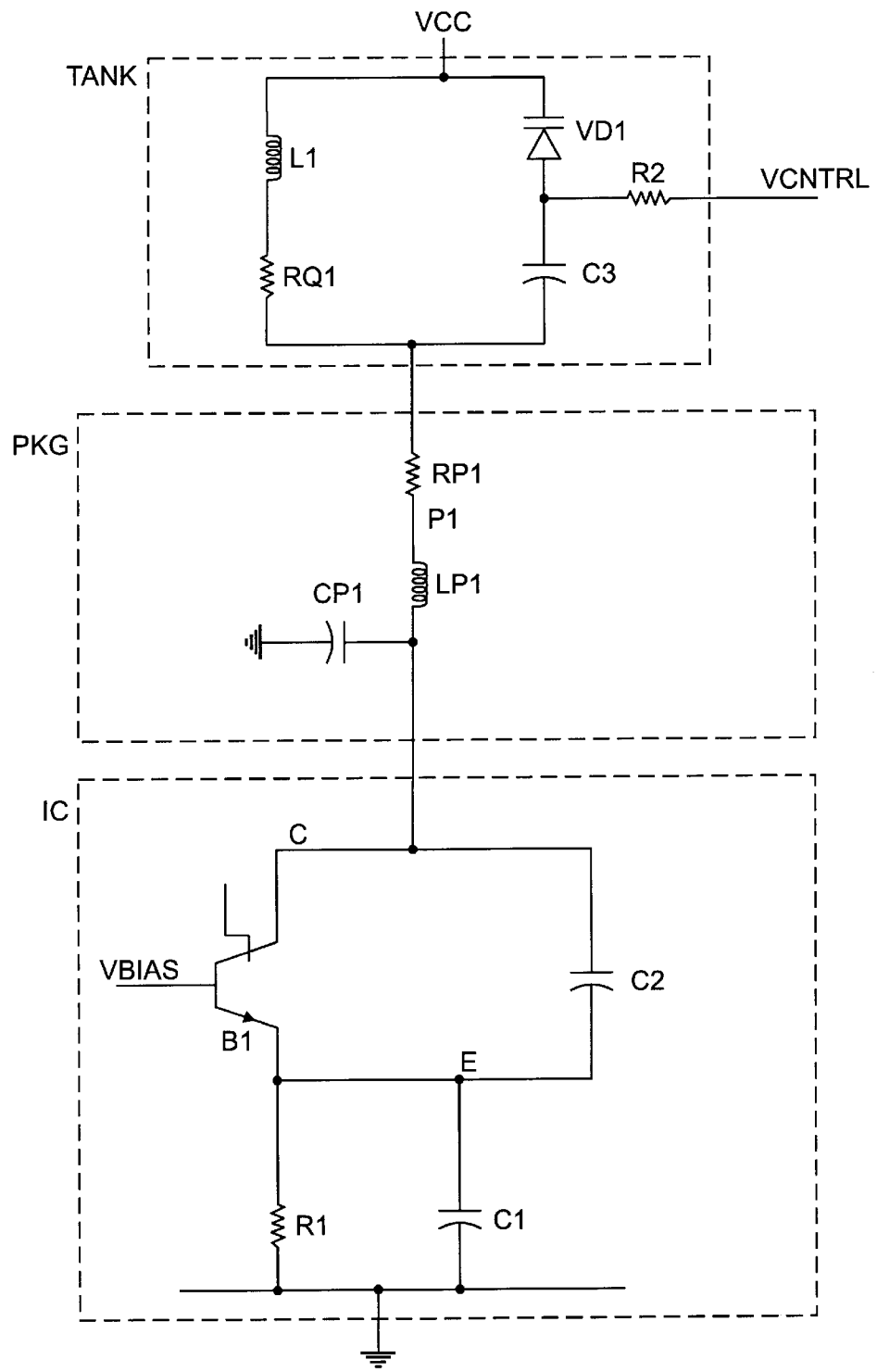
FIG. 9 shows the conventional Colpitts oscillator circuit of FIG. 8, as implemented with the tank circuit external to the integrated circuit (IC).

Next, FIG. 9 illustrates the active oscillator circuit of FIG. 8, including transistor B1, contained in an integrated circuit (IC) package (the "IC" portion 20, the "package" portion 30 (indicating the package leads/bond wire inductances and capacitances), and the "external" resonant tank circuit 10, each correspond to the identifying numbers in FIG. 6). As in FIG. 3, the bond pad capacitance and the bond wire inductance become an additional undesired second resonant tank circuit. In FIG. 9, CP1, LP1 and RP1 model the package lead and bond wire parasitic components (the ground wire parasitic is not shown or simulated in FIGS. 9 or 10 for simplicity). As in FIG. 3, the circuit of FIG. 9 could oscillate at an unwanted higher frequency.

Figure 10:
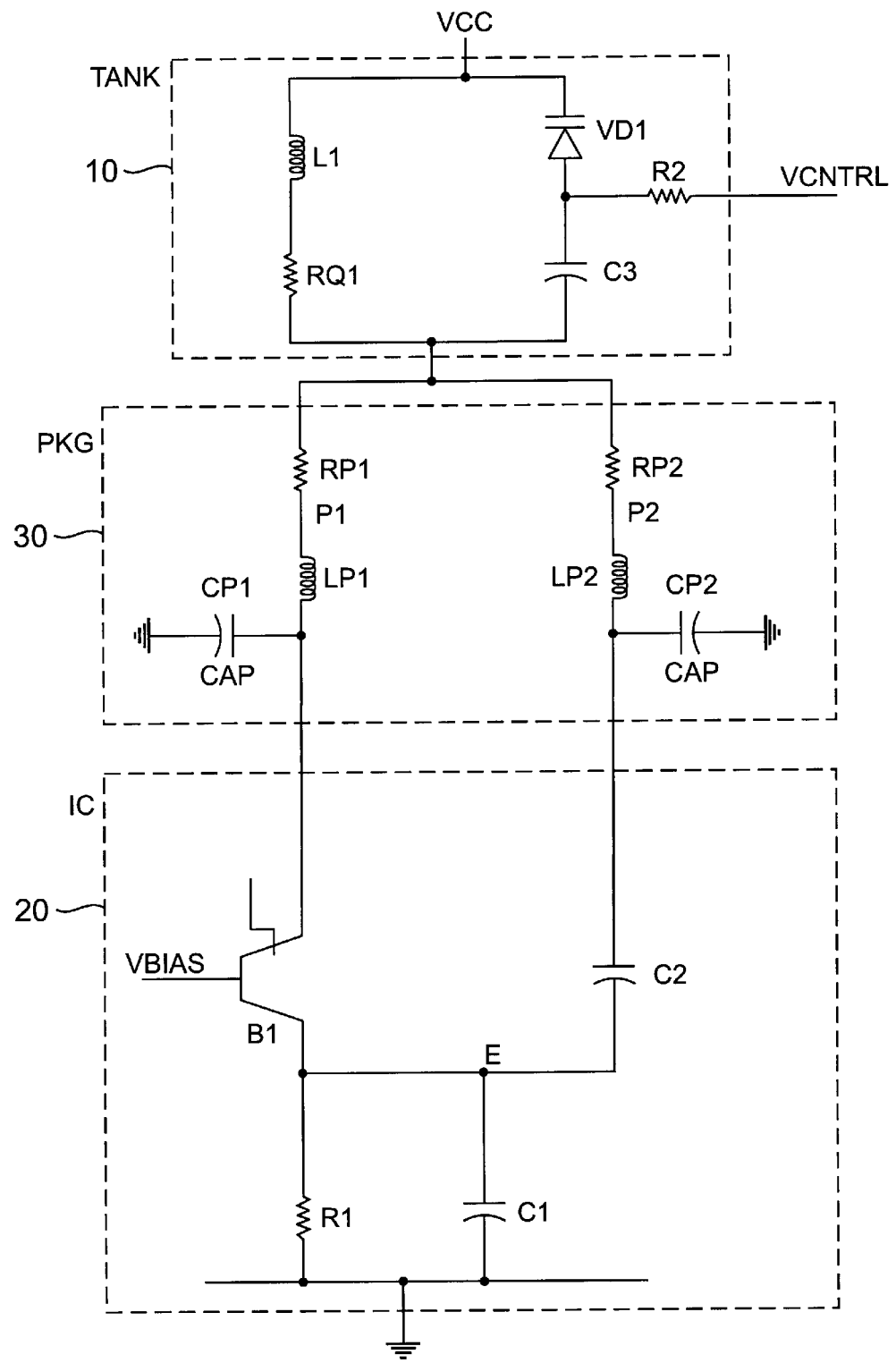
FIG. 10 shows a second embodiment of a Colpitts-type VCO circuit incorporating the inventive technique.

FIG. 10 shows a second embodiment of the aspects proposed by the invention, incorporated into the exemplary form of a Colpitts VCO design in FIGS. 8 and 9. Simulations of the FIG. 8 circuit indicated the VCO would oscillate at the target frequency of 500 MHz. However, when the parasitic model for the bond wire to couple to the tank as shown in FIG. 9, was added to the simulation, an unwanted resonant mode of 1.8 GHz occurred. As proposed in FIG. 10, by adding an additional bond wire to move the negative resistance point outside the package, the unwanted 1.8 GHz resonant mode disappeared by moving back into the left half frequency plane.

Figure 11:
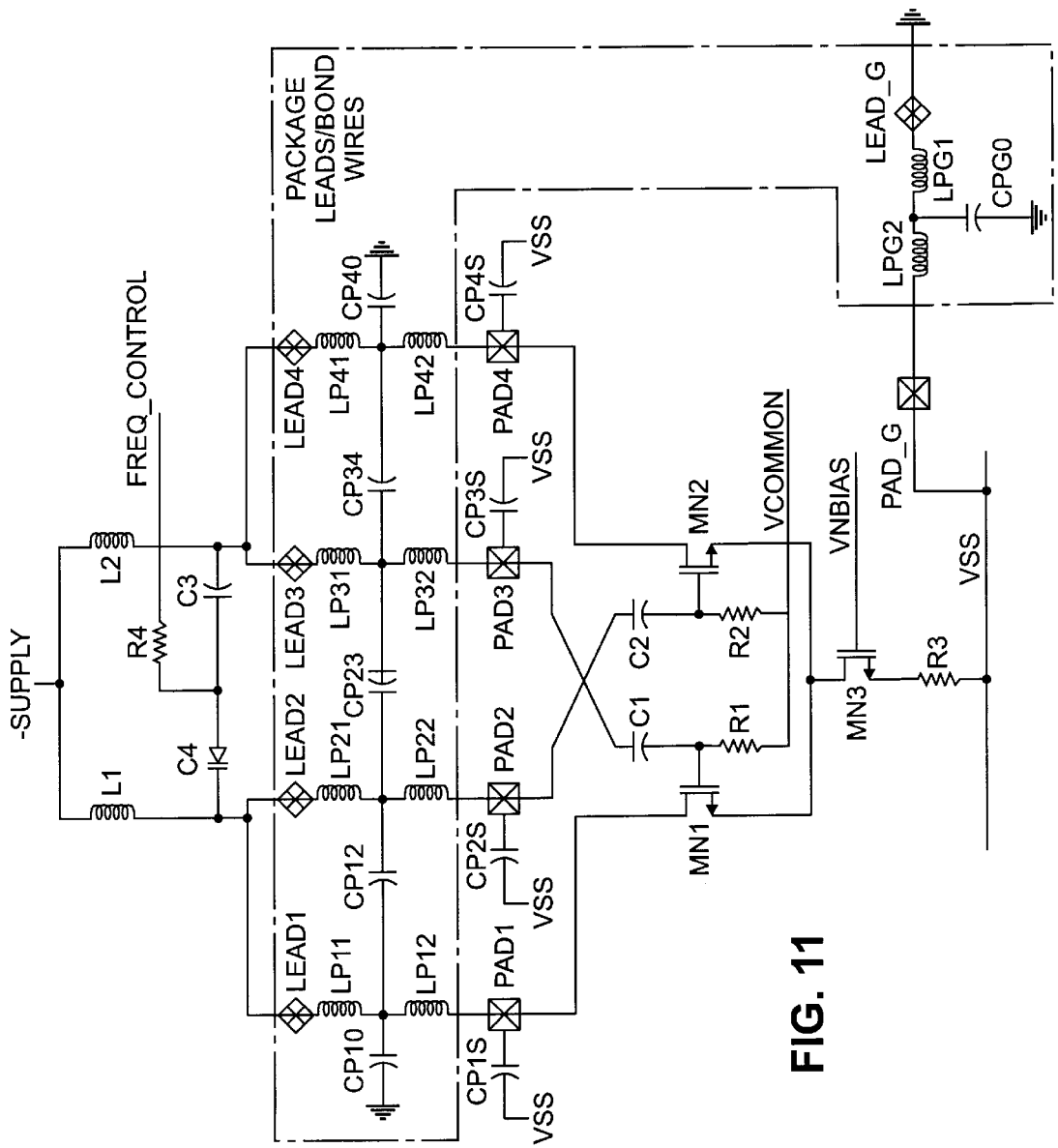
FIG. 11 shows a third embodiment of a VCO circuit, having a MOS type semiconductor, incorporating the inventive technique.

Finally, FIG. 11 shows a third embodiment of a VCO circuit, having a MOS type semiconductor, incorporating the inventive technique. The circuit of FIG. 11 is similar to the bipolar transistor design of FIG. 10, but incorporates a MOS type cross-coupled transistor pair for the bipolar transistor pair. Specifically, transistors MN1 and MN2 are coupled to form a positive feedback circuit. As in FIG. 7, the capacitive cross-coupling is brought out of the IC through separate leads and the connection made outside the package. Specifically, the drain of transistor MN1 is connected to LEAD 1 through PAD 1 and the gate of transistor MN2 is connected to LEAD 2 through PAD 2. A connection between LEADs 1 and 2 is then made outside the IC package, thereby mitigating the effect of package parasitics. Similar external connections are made between the drain of MN2 and the gate of MN1.

It will be appreciated by those skilled in the art that the inventive aspects incorporated into each of the exemplary circuits described herein are applicable to any type of oscillator circuit, either bipolar or MOS, in which package parasitics may be mitigated by providing external connections.

More specifically, in each of the circuits of FIGS. 7, 10 and 11, providing exemplary embodiments of the invention, the negative resistance is seen only outside the package because the capacitive cross-coupling (in FIGS. 7 and 11) and the feedback loop circuit (in FIG. 10) is brought out through separate leads and the connection made outside the package. The circuit proposed has the advantage of mitigating package parasitics, allowing a simpler circuit internal to the IC. In addition, the design eliminates the need for "internal traps", thereby saving valuable chip area. Still further, by mitigating the effect of package parasitics, the proposed circuit allows the target VCO frequency range to be nearly the same as (or higher than) the unwanted resonance of the bond wires, leads, and parasitic capacities. Finally, the proposed design allows ESD protection diodes to be added to each of the bond pads with minimal impact on circuit performance.

Although various embodiments are specifically illustrated and described herein, it will be appreciated that modifications and variations of the present invention are covered by the above teachings and within the purview of the appended claims without departing from the spirit and scope of the invention.

What is claimed is:

1. A Voltage Controlled Oscillator (VCO) comprising:
   an electronic circuit, with gain, that is at least part of an integrated circuit (IC);
   a package for the IC; and
   a passive resonant circuit external to the IC package;
   wherein positive feedback of said electronic circuit, to sustain a desired oscillation, is provided through at least one additional lead of said package.

2. A VCO according to claim 1, wherein said electronic circuit is comprised of at least one transistor.

3. A VCO according to claim 1, wherein said electronic circuit is comprised of a transistor pair together with bias circuits to form active gain for the VCO.

4. A VCO according to claim 3, wherein the transistor pair is capacitively cross-coupled by connections made external to said package.

5. A VCO according to claim 4, wherein a separate one of four bond pads are connected to a collector of the first transistor, a collector of the second transistor, a base of the first transistor, and a base of the second transistor.

6. A VCO according to claim 5,
   wherein the base of the first transistor and the collector of the second transistor are connected outside said package, and
   further wherein the base of the second transistor and the collector of the first transistor are connected outside said package.

7. A VCO according to claim 4, wherein a separate one of four bond pads are connected to a drain of the first transistor, a drain of the second transistor, a gate of the first transistor, and a gate of the second transistor.

8. A VCO according to claim 7,
   wherein the gate of the first transistor and the drain of the second transistor are connected outside said package, and
   further wherein the gate of the second transistor and the drain of the first transistor are connected outside said package.

9. A VCO according to claim 1, wherein said electronic circuit is comprised of a transistor together with bias circuits to form active gain for the VCO.

10. A VCO according to claim 9, wherein connections of a feedback loop to obtain a required phase shift is made external to said package.

11. A VCO according to claim 10, wherein the collector of the transistor is connected to one of two bond pads and a feedback loop from the collector to the emitter is connected to the other one of the two bond pads.

12. A VCO according to claim 10, wherein the drain of the transistor is connected to one of two bond pads and a feedback loop from the drain to the source is connected to the other one of the two bond pads.

13. A VCO according to claim 11, wherein one side of a feedback capacitor in the feedback loop is connected to the other one of the two bond pads.

14. A VCO according to claim 12, wherein one side of a feedback capacitor in the feedback loop is connected to the other one of the two bond pads.

15. A VCO according to claim 13,
wherein the collector of the transistor and the one side of the feedback capacitor are connected outside said package, wherein the connection closes the feedback loop external to said package.

16. A VCO according to claim 14,
wherein the drain of the transistor and the one side of the feedback capacitor are connected outside said package, wherein the connection closes the feedback loop external to said package.

17. A VCO according to claim 2, wherein the at least one transistor is bipolar in type.

18. A VCO according to claim 2, wherein the at least one transistor is metal-oxide semiconductor (MOS) in type.

19. A VCO according to claim 1, wherein the passive resonant circuit is an inductor-capacitor tank.

20. A VCO according to claim 19, wherein a capacitance of the inductor-capacitor tank includes a varactor diode to achieve frequency control through a voltage to capacitance change.

21. A VCO according to claim 1, wherein the passive resonant circuit is a crystal and varactor combination.

22. A VCO according to claim 1, wherein the passive resonant circuit includes a mechanically tuned capacitor.

23. A VCO according to claim 1, wherein the passive resonant circuit is a parallel inductance-capacitance-resistance (LCR) circuit.

24. A method for reducing the effect of package parasitics on a Voltage Controlled Oscillator (VCO), having an electronic circuit with gain that is at least part of an integrated circuit (IC), a package for the IC and a passive resonant circuit external to the IC package, comprising the steps of:
providing at least one additional lead for the package, and
connecting the electronic circuit such that positive feedback of the electronic circuit, to sustain a desired oscillation, is provided through the at least one additional lead of the package by connections made external to the package.

25. A Voltage Controlled Oscillator (VCO) comprising:
an electronic circuit, with gain, that is at least part of an integrated circuit (IC); and
a package for the IC;
wherein said electronic circuit and package is adapted to be coupled to components external to the IC package, including a passive resonant circuit, such that positive feedback of said electronic circuit, to sustain a desired oscillation, is provided through at least one additional lead of said package.

* * * * *